United States Patent
Sung et al.

(10) Patent No.: US 8,846,547 B2
(45) Date of Patent: Sep. 30, 2014

(54) THIN FILM DEPOSITION APPARATUS, METHOD OF MANUFACTURING ORGANIC LIGHT-EMITTING DISPLAY DEVICE BY USING THE THIN FILM DEPOSITION APPARATUS, AND ORGANIC LIGHT-EMITTING DISPLAY DEVICE MANUFACTURED BY USING THE METHOD

(75) Inventors: Un-Cheol Sung, Yongin (KR); Dong-Seob Jeong, Yongin (KR); Jung-Yeon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/175,626

(22) Filed: Jul. 1, 2011

(65) Prior Publication Data
US 2012/0068199 A1    Mar. 22, 2012

(30) Foreign Application Priority Data

Sep. 16, 2010 (KR) .......................... 10-2010-0091094

(51) Int. Cl.
| | |
|---|---|
| H01L 21/203 | (2006.01) |
| B05C 19/04 | (2006.01) |
| C23C 14/24 | (2006.01) |
| C23C 14/04 | (2006.01) |
| H01L 51/56 | (2006.01) |

(52) U.S. Cl.
CPC ............. *C23C 14/042* (2013.01); *C23C 14/243* (2013.01); *H01L 51/56* (2013.01); *C23C 14/24* (2013.01)
USPC ............. 438/780; 118/726; 118/727; 438/28; 438/34; 257/E33.002

(58) Field of Classification Search
None
See application file for complete search history.

(56) References Cited

U.S. PATENT DOCUMENTS 6,274,198 B1    8/2001 Dautartas
6,371,451 B1    4/2002 Choi
(Continued)

FOREIGN PATENT DOCUMENTS

EP    1 413 644 A2    4/2004
EP    1 418 250 A2    5/2004
(Continued)

OTHER PUBLICATIONS

Patent Abstracts of Japan, and English machine translation of Japanese Publication 2001-052862, 20 pages.

(Continued)

*Primary Examiner* — Johannes P Mondt
(74) *Attorney, Agent, or Firm* — Christie, Parker & Hale, LLP (57) ABSTRACT

A thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method. The thin film deposition apparatus includes: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in the first direction; a first barrier plate assembly including a plurality of first barrier plates that are disposed between the deposition source nozzle unit and the patterning slit sheet in the first direction, and that partition a space between the deposition source nozzle unit and the patterning slit sheet into a plurality of sub-deposition spaces; and a second barrier plate disposed at one side of the patterning slit sheet, wherein an inner part of the second barrier plate is partitioned into a plurality of spaces by a plurality of barrier ribs.

20 Claims, 5 Drawing Sheets

(56) References Cited

U.S. PATENT DOCUMENTS

| | | | |
|---|---|---|---|
| 6,749,906 B2 | 6/2004 | Van Slyke | |
| 6,837,939 B1 * | 1/2005 | Klug et al. | 118/726 |
| 7,015,154 B2 | 3/2006 | Yamazaki et al. | |
| 7,273,526 B2 | 9/2007 | Shinriki et al. | |
| 7,677,195 B2 | 3/2010 | Lee et al. | |
| 8,006,639 B2 | 8/2011 | Kim et al. | |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0115338 A1 | 6/2004 | Yoneda | |
| 2004/0115339 A1 | 6/2004 | Ito | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0166842 A1 | 8/2005 | Sakamoto | |
| 2005/0257745 A1 | 11/2005 | Abiko et al. | |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0104890 A1 * | 5/2007 | Boroson et al. | 427/557 |
| 2007/0176534 A1 | 8/2007 | Abiko et al. | |
| 2007/0178708 A1 | 8/2007 | Ukigaya | |
| 2008/0018236 A1 | 1/2008 | Arai et al. | |
| 2008/0050521 A1 | 2/2008 | Ma et al. | |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0232976 A1 | 9/2009 | Yoon et al. | |
| 2010/0297348 A1 | 11/2010 | Lee et al. | |
| 2011/0053301 A1 | 3/2011 | Kang et al. | |

FOREIGN PATENT DOCUMENTS

| | | | |
|---|---|---|---|
| EP | 1 418250 A2 * | 5/2004 | C23C 14/24 |
| EP | 1 518 940 A1 | 3/2005 | |
| JP | 04-272170 | 9/1992 | |
| JP | 11-100663 A * | 4/1999 | C23C 14/24 |
| JP | 2000-068054 | 3/2000 | |
| JP | 2001-052862 | 2/2001 | |
| JP | 2001-093667 | 4/2001 | |
| JP | 2001-287328 | 10/2001 | |
| JP | 2002-175878 | 6/2002 | |
| JP | 2003-003250 | 1/2003 | |
| JP | 2003-077662 | 3/2003 | |
| JP | 2003-157973 | 5/2003 | |
| JP | 2003-297562 | 10/2003 | |
| JP | 2004-043898 | 2/2004 | |
| JP | 2004-103269 | 4/2004 | |
| JP | 2004-103341 | 4/2004 | |
| JP | 2004-199919 | 7/2004 | |
| JP | 2005-044592 | 2/2005 | |
| JP | 2005-235568 | 9/2005 | |
| JP | 2005-293968 | 10/2005 | |
| JP | 2005-296737 | 10/2005 | |
| JP | 2005-330551 | 12/2005 | |
| JP | 2006-275433 | 10/2006 | |
| JP | 2007-047293 | 2/2007 | |
| JP | 2008-121098 | 5/2008 | |
| JP | 2009-019243 | 1/2009 | |
| JP | 2009-087910 | 4/2009 | |
| KP | 10-2002-0000201 | 1/2002 | |
| KP | 10-2003-0091947 | 12/2003 | |
| KR | 10-0257219 B1 | 2/2000 | |
| KR | 10-2000-0019254 | 4/2000 | |
| KR | 10-2000-0023929 | 5/2000 | |
| KR | 10-2001-0059939 | 7/2001 | |
| KR | 10-2002-0050922 | 6/2002 | |
| KR | 10-2002-0090934 | 12/2002 | |
| KR | 10-0405080 | 11/2003 | |
| KR | 10-2003-0093959 | 12/2003 | |
| KR | 10-2004-0034537 | 4/2004 | |
| KR | 10-2004-0050045 | 6/2004 | |
| KR | 10-2004-0069281 | 8/2004 | |
| KR | 10-2004-0084747 | 10/2004 | |
| KR | 10-0463212 | 12/2004 | |
| KR | 10-0520159 | 10/2005 | |
| KR | 10-2006-0008602 | 1/2006 | |
| KR | 10-2006-0018745 | 3/2006 | |
| KR | 10-2006-0073367 | 6/2006 | |
| KR | 10-2006-0080475 | 7/2006 | |
| KR | 10-2006-0080481 | 7/2006 | |
| KR | 10-2006-0080482 | 7/2006 | |
| KR | 10-2006-0083510 | 7/2006 | |
| KR | 10-2006-0104675 | 10/2006 | |
| KR | 10-2006-0104677 | 10/2006 | |
| KR | 10-2006-0109627 | 10/2006 | |
| KR | 10-0646160 | 11/2006 | |
| KR | 10-0687007 | 2/2007 | |
| KR | 10-0696547 B1 | 3/2007 | |
| KR | 10-0698033 | 3/2007 | |
| KR | 10-0700466 | 3/2007 | |
| KR | 10-2007-0035796 | 4/2007 | |
| KR | 10-0711885 | 4/2007 | |
| KR | 10-2007-0050793 A | 5/2007 | |
| KR | 10-0723627 B1 | 5/2007 | |
| KR | 10-0726132 | 6/2007 | |
| KR | 10-2007-0078713 | 8/2007 | |
| KR | 10-2007-0080635 | 8/2007 | |
| KR | 10-2007-0101842 | 10/2007 | |
| KR | 10-2007-0105595 | 10/2007 | |
| KR | 10-0770653 B1 | 10/2007 | |
| KR | 10-2008-0001184 | 1/2008 | |
| KR | 10-0797787 B1 | 1/2008 | |
| KR | 10-0800125 B1 | 1/2008 | |
| KR | 10-0815265 | 3/2008 | |
| KR | 10-0823508 B1 | 4/2008 | |
| KR | 10-0827760 B1 | 5/2008 | |
| KR | 10-0839380 B1 | 6/2008 | |
| KR | 10-2008-0060400 | 7/2008 | |
| KR | 10-2008-0061132 | 7/2008 | |
| KR | 10-2008-0062212 | 7/2008 | |
| KR | 10-2008-0078290 A | 8/2008 | |
| KR | 10-2009-0038733 | 4/2009 | |
| KR | 10-2009-0097453 | 9/2009 | |

OTHER PUBLICATIONS

Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, datedugust 5, 2005, for corresponding Korean Patent 10-0700466 listed above.
Korean Patent Abstracts, Publication No. 1020070025164, dated Mar. 8, 2007, for corresponding Korean Patent 10-0711885 listed above.

(56) References Cited

OTHER PUBLICATIONS

Korean Patent Abstracts, Publication No. 1020020034272, dated May 9, 2002, for corresponding Korean Patent 10-0726132 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020070050793. dated May 16, 2007, for corresponding Korean Patent 10-0815265 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
U.S. Office action dated Oct. 12, 2012, for cross reference U.S. Appl. No. 12/836,760, (22 pages).
U.S. Notice of Allowance dated Feb. 12, 2013, for cross reference U.S. Appl. No. 12/797,858, (8 pages).
U.S. Office action dated May 9, 2013, for cross reference U.S. Appl. No.12/836,760, (12 pages).
U.S. Office action dated Sep. 24, 2012, for cross reference U.S. Appl. No. 12/797,858, (20 pages).
U.S. Office action dated Oct. 30, 2013, for cross reference U.S. Appl. No. 12/836,760, (17 pages).

\* cited by examiner

THIN FILM DEPOSITION APPARATUS, METHOD OF MANUFACTURING ORGANIC LIGHT-EMITTING DISPLAY DEVICE BY USING THE THIN FILM DEPOSITION APPARATUS, AND ORGANIC LIGHT-EMITTING DISPLAY DEVICE MANUFACTURED BY USING THE METHOD

CROSS-REFERENCE TO RELATED PATENT APPLICATION

This application claims priority to and the benefit of Korean Patent Application No. 10-2010-0091094, filed on Sep. 16, 2010, in the Korean Intellectual Property Office, the entire content of which is incorporated herein by reference.

BACKGROUND

1. Field

The following description relates to a thin film deposition apparatus, a method of manufacturing an organic light-emitting display device by using the thin film deposition apparatus, and an organic light-emitting display device manufactured by using the method, and more particularly, to a thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method.

2. Description of the Related Art

An organic light-emitting display device has a larger viewing angle, a better contrast characteristic, and a faster response rate as compared with other display devices, and thus has drawn attention as a next-generation display device.

An organic light-emitting display device includes intermediate layers, including an emission layer disposed between a first electrode and a second electrode that are arranged to face each other. The electrodes and the intermediate layers may be formed via various methods, one of which is a deposition method. When an organic light-emitting display device is manufactured using the deposition method, a fine metal mask (FMM) having the same pattern as a thin layer to be formed is disposed to closely contact a substrate, and a thin film material is deposited over the FMM in order to form the thin layer having the desired pattern.

However, the deposition method using such a FMM is not suitable for manufacturing larger devices using a mother glass having a fifth-generation (5G) size or greater. In other words, when such a large mask is used, the mask may bend due to its own gravity, thereby distorting a pattern, which is not conducive for the recent trend towards high-definition patterns.

SUMMARY

Aspects of embodiments of the present invention are directed toward a thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method.

According to an embodiment of the present invention, there is provided a thin film deposition apparatus for forming a thin film on a substrate, the thin film deposition apparatus including: a deposition source configured to discharge a deposition material; a deposition source nozzle unit at a side of the deposition source and including a plurality of deposition source nozzles arranged in a first direction; a patterning slit sheet disposed to face the deposition source nozzle unit and including a plurality of patterning slits arranged in the first direction; a first barrier plate assembly including a plurality of first barrier plates, the first barrier plates being disposed between the deposition source nozzle unit and the patterning slit sheet in the first direction, and being configured to partition a space between the deposition source nozzle unit and the patterning slit sheet into a plurality of sub-deposition spaces; and a second barrier plate disposed at one side of the patterning slit sheet and including a plurality of barrier ribs, wherein an inner part of the second barrier plate is partitioned into a plurality of spaces by the barrier ribs.

In one embodiment, the thin film deposition apparatus is separated from the substrate by a distance, and the thin film deposition apparatus or the substrate is movable relative to each other.

In one embodiment, the second barrier plate has a honeycomb shape structure and includes a plurality of hollow hexagonal pillars formed by the barrier ribs, and the hollow hexagonal pillars are formed adjacent to each other. The second barrier plate may be formed in which each surface of the hollow hexagonal pillars contacts a neighboring one of the hollow hexagonal pillars, and/or each surface of the hollow hexagonal pillars may have an identical shape.

In one embodiment, the second barrier plate is on the side of the patterning slit sheet facing the deposition source. The thin film deposition apparatus may further include a frame having a window frame shape, wherein the patterning slit sheet is in a region defined by inner sides of the frame, and the second barrier plate is fixed to the frame. The patterning slit sheet and the second barrier plate may be adhered to each other.

In one embodiment, the first barrier plate assembly is configured to guide the deposition material discharged from the deposition source.

In one embodiment, the plurality of first barrier plates are arranged at identical intervals.

In one embodiment, each of the plurality of first barrier plates extends in a second direction substantially perpendicular to the first direction, in order to partition the space between the deposition source nozzle unit and the patterning slit sheet into the plurality of sub-deposition spaces.

In one embodiment, the thin film deposition apparatus is configured to continuously deposit the deposition material discharged from the thin film deposition apparatus on the substrate while the substrate or the thin film deposition apparatus is moved relative to the other.

In one embodiment, the thin film deposition apparatus or the substrate is movable relative to the other along a plane parallel to a surface of the substrate, on which the deposition material is deposited.

In one embodiment, the patterning slit sheet of the thin film deposition apparatus is smaller than the substrate.

In one embodiment, the first barrier plate assembly is detachable from the thin film deposition apparatus.

According to another embodiment of the present invention, there is provided a method of manufacturing an organic light-emitting display device including a deposition, a deposition source nozzle unit, a patterning slit sheet, a first barrier plate assembly, and a second barrier plate, the method including: arranging the deposition source nozzle unit at a side of the deposition source, the deposition source nozzle unit including a plurality of deposition source nozzles arranged in a first direction; arranging the patterning slit sheet to face the deposition source nozzle unit, the patterning slit sheet including a plurality of patterning slits arranged in the first direction; arranging the first barrier plate assembly including a plurality of first barrier plates disposed between the deposition source nozzle unit and the patterning slit sheet in the first direction, and partitioning with the first barrier plates a space between the deposition source nozzle unit and the patterning slit sheet into a plurality of sub-deposition spaces; arranging the second barrier plate at one side of the patterning slit sheet, wherein an inner part of the second barrier plate is partitioned into a plurality of spaces by a plurality of barrier ribs of the second barrier plate; fixing a substrate fixed to a chuck; and discharging a deposition material from the deposition source and moving the film deposition apparatus or the substrate fixed to the chuck relative to each other while deposition is performed on the substrate.

According to another embodiment of the present invention, there is provided an organic light-emitting display device manufactured utilizing the above method.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
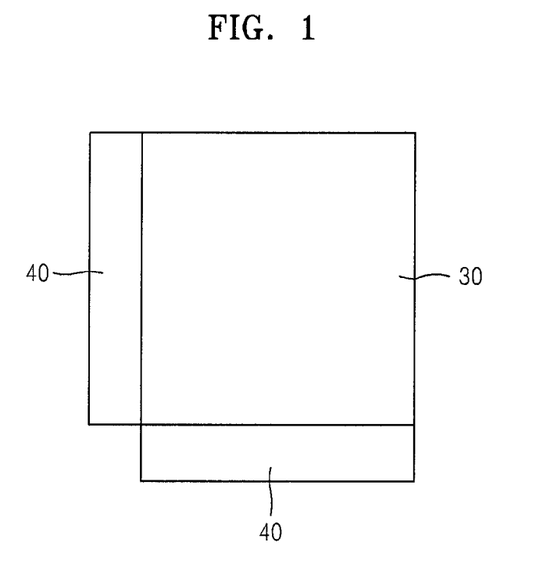
FIG. 1 is a plan view of an organic light-emitting display device manufactured by using a thin film deposition apparatus, according to an embodiment of the present invention.

FIG. 1 is a plan view of an organic light-emitting display device manufactured by using a thin film deposition apparatus, according to an embodiment of the present invention.

Referring to FIG. 1, the organic light-emitting display device includes a pixel region (or display region) 30 and circuit regions 40 disposed at edges of the pixel region 30. The pixel region 30 includes a plurality of pixels, each of which includes an emission unit that emits light to display an image.

In an embodiment of the present invention, the emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. The organic light-emitting display device according to an embodiment of the present embodiment may include or be a monochromatic flat display device.

The circuit regions 40 control, for example, an image signal that is input to the pixel region 30. In the organic light-emitting display device according to an embodiment, at least one thin film transistor (TFT) may be installed in each of the pixel region 30 and the circuit region 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in the circuit region 40 may include a circuit TFT constituted to implement a set or predetermined circuit.

The number and arrangement of TFTs may suitably vary according to the features of a display device and the driving method thereof.

Figure 2:
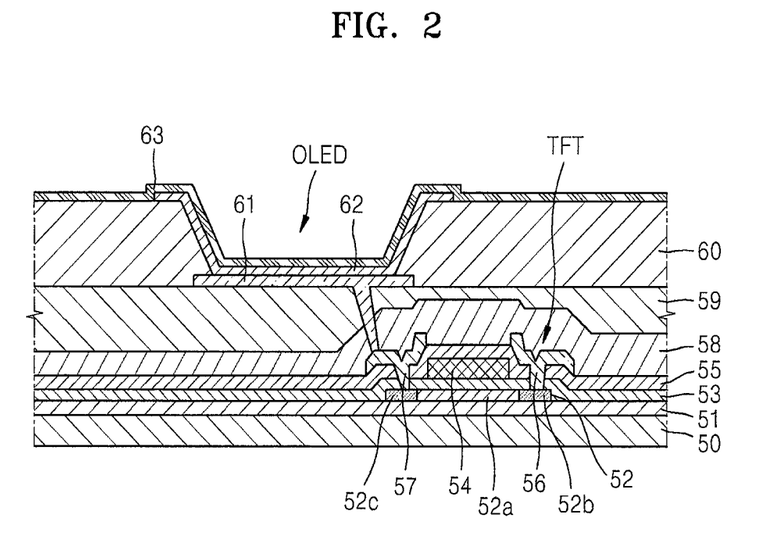
FIG. 2 is a sectional view of a sub-pixel of the organic light-emitting display device illustrated in FIG. 1, according to an embodiment of the present invention.

FIG. 2 is a sectional view of a sub-pixel of the organic light-emitting display device illustrated in FIG. 1, according to an embodiment of the present invention.

Referring to FIG. 2, a buffer layer 51 is formed on a substrate 50 formed of glass and/or plastic. A TFT and an OLED are formed on the buffer layer 51.

An active layer 52 having a set or predetermined pattern is formed on the buffer layer 51. Here, the active layer 52 includes a channel region 52a, and source/drain regions 52b and 52c. A gate insulating layer 53 is formed on the active layer 52, and a gate electrode 54 is formed in a set or predetermined region of the gate insulating layer 53. The gate electrode 54 is connected to a gate line via which a TFT ON/OFF signal is applied. An interlayer insulating layer 55 is formed on the gate electrode 54. Source/drain electrodes 56 and 57 are formed such as to contact the source/drain regions 52a and 52c, respectively, of the active layer 52 through contact holes. A passivation layer 58 is formed of $SiO_2$, $SiN_x$, or the like, on the source/drain electrodes 56 and 57. A planarization layer 59 is formed of an organic material, such as acryl, polyimide, benzocyclobutene (BCB), or the like, on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. The present invention is not limited to the structure of the organic light-emitting display device described above, and various suitable structures of organic light-emitting display devices may be applied in the present invention.

The OLED displays set or predetermined image information by emitting red, green and blue light as current flows. The OLED includes the pixel electrode 61, which is connected to the drain electrode 56 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials include copper phthalocyanine (CuPc), N,N'-di(naphthalene-1-yl)-N,N'-diphenyl-benzidine (NPB), tris-8-hydroxyquinoline aluminum (Alq3), or the like. The low-molecular weight organic layer may be formed by vacuum deposition.

When a high-molecular weight organic layer is used as the organic layer 62, the organic layer 62 may mostly have a structure including an HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various suitable ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. The transparent electrode may be formed of indium tin oxide (ITO), indium zinc oxide (IZO), zinc oxide (ZnO), or indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display device described above, the organic layer 62 including the emission layer may be formed by using a thin film deposition apparatus 100 (refer to FIG. 3), which is described as follows.

Figure 3:
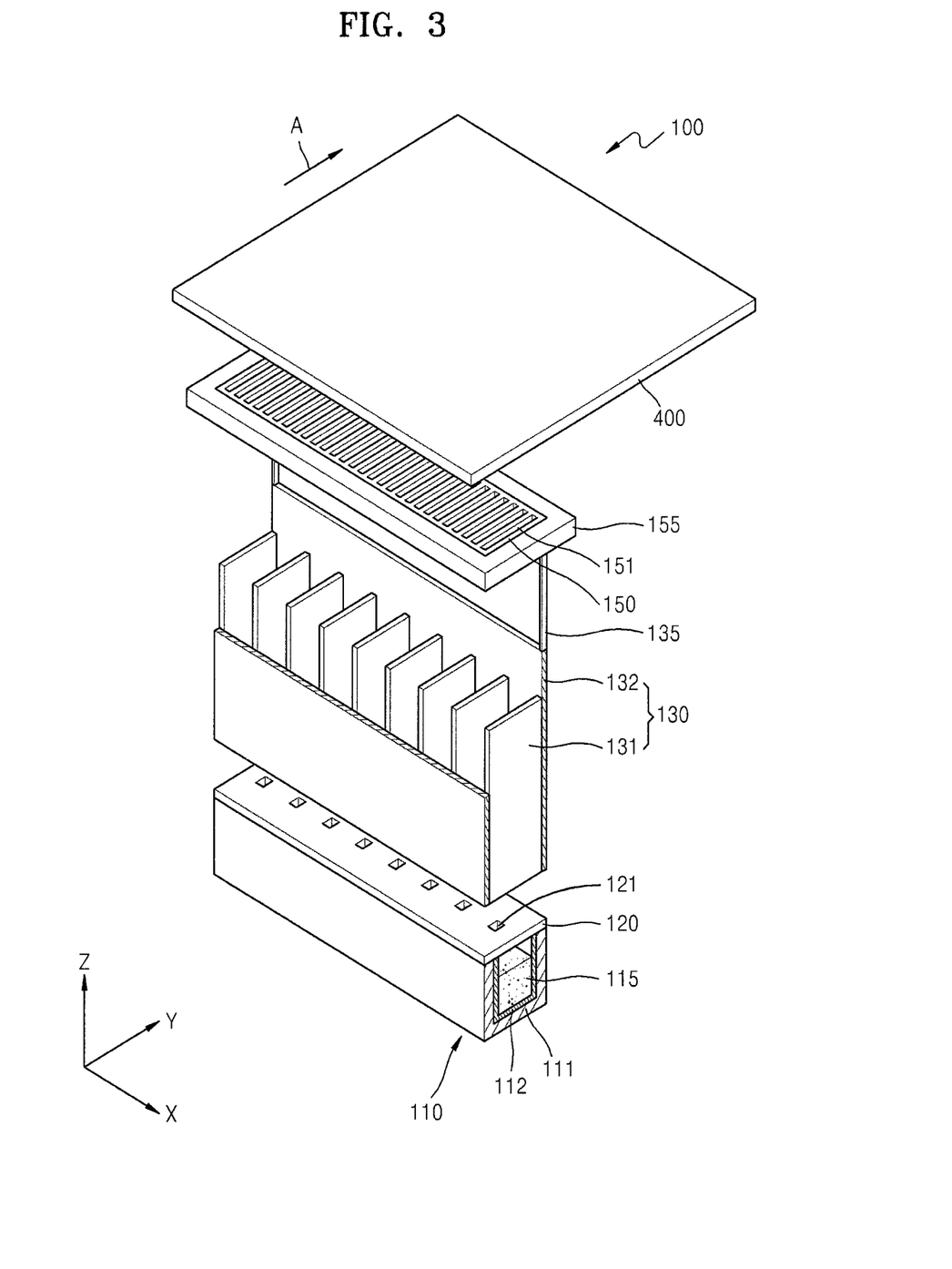
FIG. 3 is a schematic perspective view of a thin film deposition apparatus according to an embodiment of the present invention.
Figure 4:
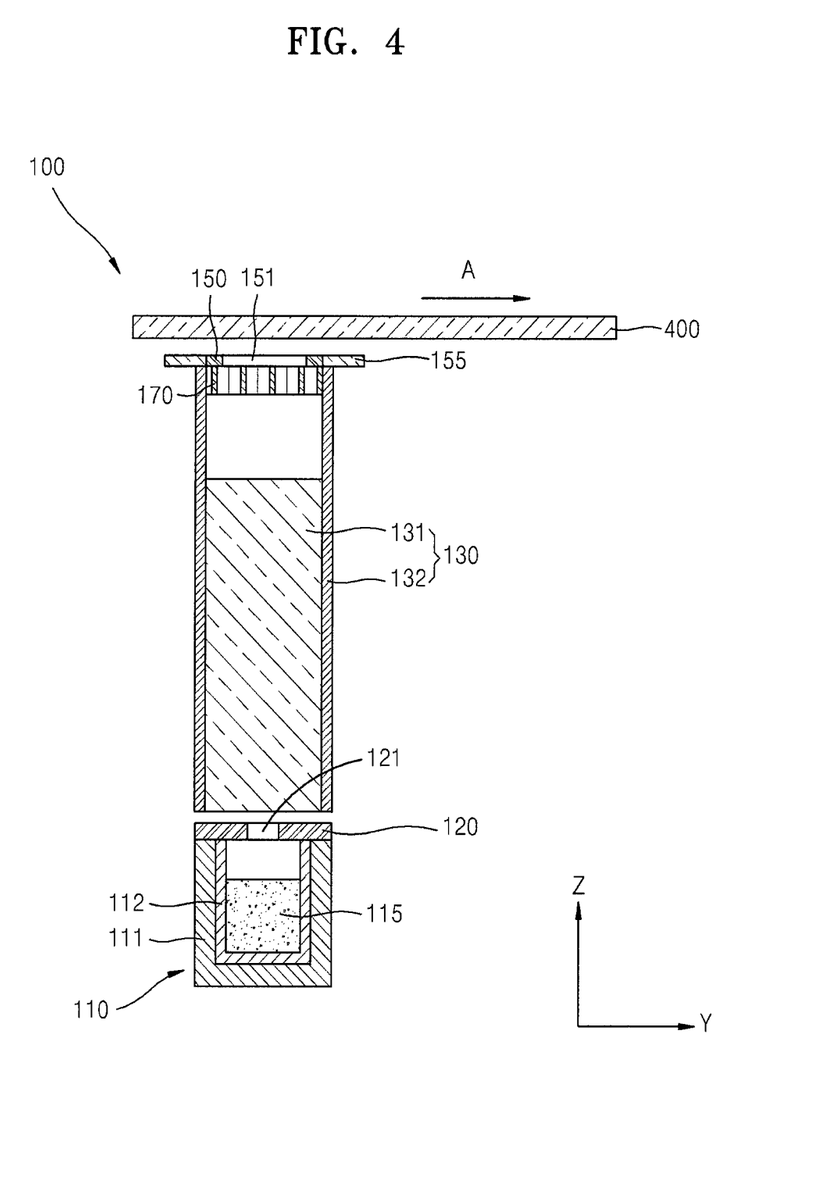
FIG. 4 is a schematic side view of the thin film deposition apparatus of FIG. 3, according to an embodiment of the present invention.
Figure 5:
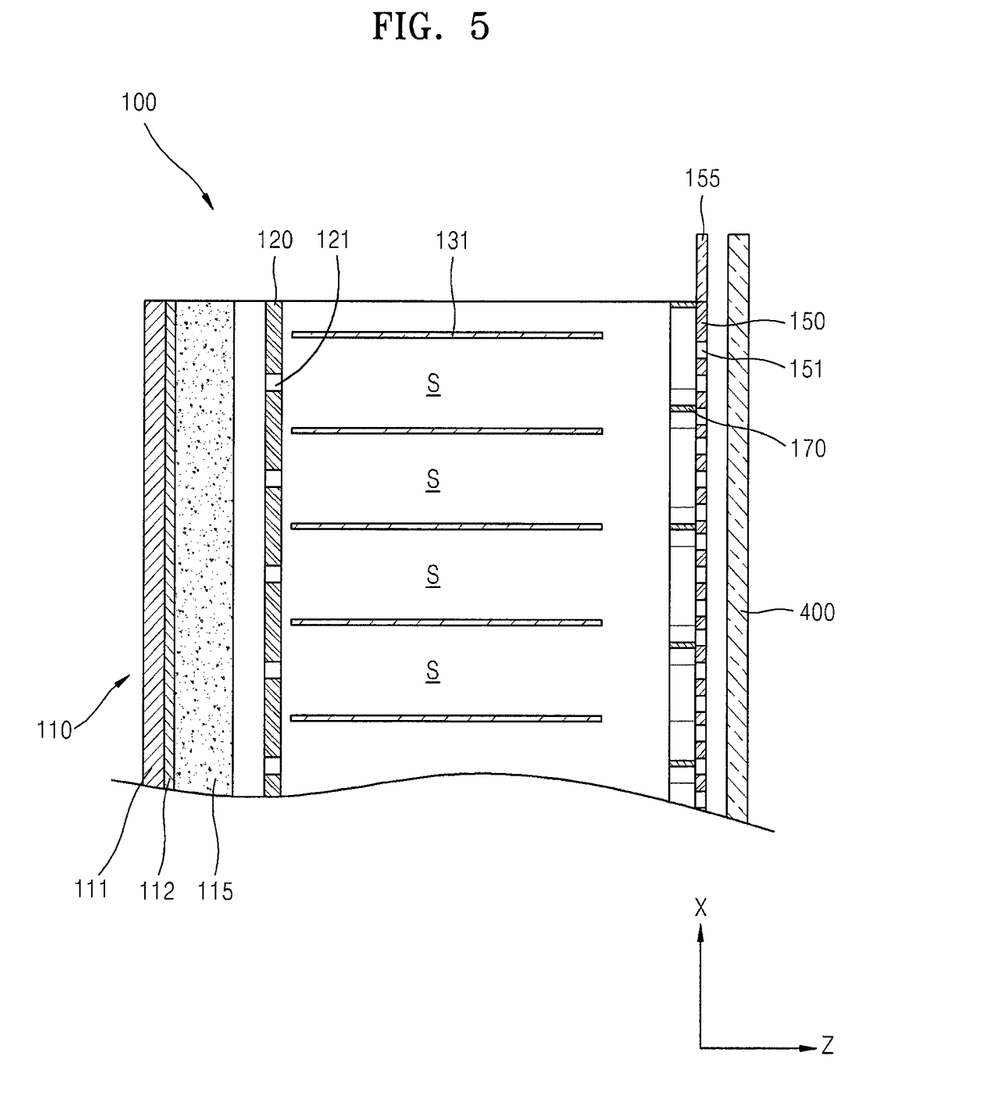
FIG. 5 is a schematic plan view of the thin film deposition apparatus illustrated in FIG. 3, according to an embodiment of the present invention.
Figure 6:
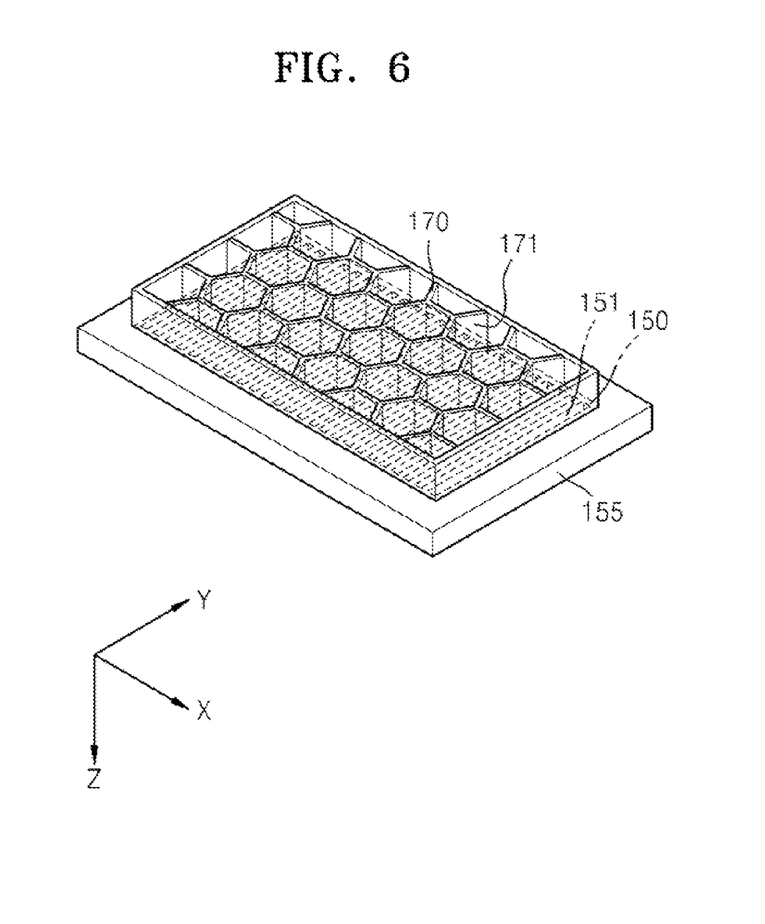
FIG. 6 is a perspective view of a combination of a second barrier plate and a patterning slit sheet in the thin film deposition apparatus of FIG. 3.

FIG. 3 is a schematic perspective view of a thin film deposition apparatus 100 according to an embodiment of the present invention, FIG. 4 is a schematic sectional view of the thin film deposition apparatus 100 illustrated in FIG. 3, and FIG. 5 is a schematic plan view of the thin film deposition apparatus 100 illustrated in FIG. 3. Also, FIG. 6 is a perspective view of a combination of a second barrier plate 170 and a patterning slit sheet 150 in the thin film deposition apparatus 100 of FIG. 3.

Referring to FIGS. 3 through 6, the thin film deposition apparatus 100 according to an embodiment of the present invention includes a deposition source 110, a deposition source nozzle unit 120, a first barrier plate assembly 130, a patterning slit sheet 150, and a second barrier plate 170.

Although a chamber is not illustrated in FIGS. 3 through 6 for convenience of explanation, all the components of the thin film deposition apparatus 100 may be disposed within the chamber that is maintained at an appropriate degree of vacuum. The chamber is maintained at an appropriate vacuum in order to allow a deposition material to move in a substantially straight line through the thin film deposition apparatus 100.

In more detail, in order to deposit a deposition material 115 that has been discharged from the deposition source 110 and passed through the deposition source nozzle unit 120 and the patterning slit sheet 150, onto a substrate 400 in a desired pattern, the chamber should be in a high-vacuum state. In addition, the temperatures of the first barrier plate assembly 130 and the patterning slit sheet 150 should be sufficiently lower than the temperature of the deposition source 110 to maintain a space between the deposition source nozzle unit 120 and the patterning slit sheet 150 in a high-vacuum state. In this regard, the temperatures of the first barrier plate assembly 130 and the patterning slit sheet 150 may be about 100° C. or less. This is because the deposition material 115 that has collided with the first barrier plate assembly 130 may not be vaporized again when the temperatures of the first barrier plate assembly 130 and the patterning slit sheet 150 are sufficiently low. In addition, thermal expansion of the patterning slit sheet 150 may be minimized when the temperature of the patterning slit sheet 150 is sufficiently low. The first barrier plate assembly 130 faces the deposition source 110 which is at a high temperature. In addition, the temperature of a portion of the first barrier plate assembly 130 close to the deposition source 110 rises to a maximum of about 167° C., and thus a partial-cooling apparatus may be further included if needed.

In the chamber, the substrate 400, which constitutes a deposition target on which the deposition material 115 is to be deposited, is transferred by an electrostatic chuck. The substrate 400 may be a substrate for flat panel displays. A large substrate, such as a mother glass, for manufacturing a plurality of flat panel displays, may be used as the substrate 400. Other suitable substrates may also be employed.

In an embodiment, the substrate 400 or the thin film deposition apparatus 100 may be moved relative to the other. For example, as illustrated in FIG. 4, the substrate 400 may be moved relative to the thin film deposition apparatus 100 in a direction of an arrow A.

In a conventional deposition method using a fine metal mask (FMM), the size of the FMM has to be greater than or equal to the size of a substrate. Thus, the size of the FMM has to be increased the larger the substrate is. However, it is neither straightforward to manufacture a large FMM nor to extend an FMM to be accurately aligned with a pattern.

Accordingly, in the thin film deposition apparatus 100 according to an embodiment of the present invention, deposition may be performed while the thin film deposition apparatus 100 or the substrate 400 is moved relative to the other. In other words, deposition may be continuously performed while the substrate 400, which is disposed facing the thin film deposition apparatus 100, is moved in a Y-axis direction. In other words, deposition is performed in a scanning manner while the substrate 400 is moved in a direction of arrow A in FIG. 3. Although the substrate 400 is illustrated as being moved in the Y-axis direction in FIG. 3 when deposition is performed, aspects of the present invention are not limited thereto. For example, deposition may be performed while the thin film deposition apparatus 100 is moved in the Y-axis direction and the substrate 400 is fixed.

Thus, in the thin film deposition apparatus 100 according to an embodiment of the present invention, the patterning slit sheet 150 may be significantly smaller than a FMM used in a conventional deposition method. In other words, in the thin film deposition apparatus 100, deposition is continuously performed, i.e., in a scanning manner while the substrate 400 is moved in the Y-axis direction. Thus, a length of the patterning slit sheet 150 in the Y-axis direction may be significantly less than a length of the substrate 400 provided that a width of the patterning slit sheet 150 in the X-axis direction and a width of the substrate 400 in the X-axis direction are substantially equal (or identical) to each other, as illustrated in FIG. 3. However, even when the width of the patterning slit sheet 150 in the X-axis direction is less than the width of the substrate 400 in the X-axis direction, deposition may be performed on the entire substrate 400 in a scanning manner while the substrate 400 or the thin film deposition apparatus 100 is moved relative to each other.

As described above, since the patterning slit sheet 150 may be formed to be significantly smaller than a FMM used in a conventional deposition method, it is relatively easy to manufacture the patterning slit sheet 150 used in embodiments of the present invention. In other words, using the patterning slit sheet 150, which is smaller than a FMM used in a conventional deposition method, is more convenient in all processes, including etching and other subsequent processes, such as precise extension, welding, moving, and cleaning processes, compared to the conventional deposition method using a larger FMM. The patterning slit sheet 150 is more advantageous for a relatively large display device.

In order to perform deposition while the thin film deposition apparatus 100 or the substrate 400 is moved relative to the other as described above, the thin film deposition apparatus 100 and the substrate 400 may be separated from each other by a set or predetermined distance, as will be described later in more detail.

The deposition source 115 that contains and heats the deposition material 110 is disposed in an opposite side of the chamber to a side in which the substrate 400 is disposed.

The deposition source 110 includes a crucible 112 that is filled with the deposition material 115, and a cooling block 111 surrounding the crucible 112. The cooling block 111 shields or prevents radiation of heat from the crucible 112 to the outside, i.e., into the chamber. The cooling block 111 may include a heater that heats the crucible 112.

The deposition source nozzle unit 120 is disposed at a side of the deposition source 110, and in particular, at the side of the deposition source 110 facing the substrate 400. The deposition source nozzle unit 120 includes a plurality of deposition source nozzles 121 arranged at equal (or identical) intervals in the X-axis direction. The deposition material 115 that is vaporized in the deposition source 110 passes through the deposition source nozzles 121 of the deposition source nozzle unit 120 towards the substrate 400, which constitutes a target on which the deposition material 115 is to be deposited.

The first barrier plate assembly 130 is disposed at a side of the deposition source nozzle unit 120. The first barrier plate assembly 130 includes a plurality of first barrier plates 131, and a first barrier plate frame 132 that covers sides of the first barrier plates 131. The plurality of first barrier plates 131 may be arranged parallel to each other at equal intervals in the X-axis direction. In addition, each of the first barrier plates 131 may be arranged parallel to a Y-Z plane in FIG. 4, and may have a rectangular shape. The plurality of first barrier plates 131 arranged as described above partition the space between the deposition source nozzle unit 120 and the patterning slit sheet 150 into a plurality of sub-deposition spaces S (see FIG. 5). In the thin film deposition apparatus 100 according to the current embodiment of the present invention, as illustrated in FIG. 5, the deposition space is divided by the first barrier plates 131 into the sub-deposition spaces S that respectively correspond to (or match) the deposition source nozzles 121 through which the deposition material 115 is discharged.

The first barrier plates 131 may be respectively disposed between adjacent deposition source nozzles 121. In other words, each of the deposition source nozzles 121 may be disposed between two adjacent first barrier plates 131. Each of the deposition source nozzles 121 may also be located at the midpoint between two adjacent first barrier plates 131. However, the present invention is not limited to this structure. For example, two or more of the plurality of deposition source nozzles 121 may be disposed between two adjacent first barrier plates 131. In this case, the two or more of the deposition source nozzles 121 may be also respectively located at the midpoint between the two adjacent first barrier plates 131.

As described above, since the first barrier plates 131 partition the space between the deposition source nozzle unit 120 and the patterning slit sheet 150 into the plurality of sub-deposition spaces S, the deposition material 115 discharged through one deposition source nozzle 121 is not mixed with the deposition material 115 discharged through another deposition source nozzle 121, and passes through patterning slits 151 so as to be deposited on the substrate 400. In other words, the first barrier plates 131 guide the deposition material 115, which is discharged through each of the deposition source nozzles slits 121, to move straight in the Z-axis direction without being dispersed.

As described above, the deposition material 115 is forced to move straight by installing the first barrier plates 131, so that a smaller shadow zone may be formed on the substrate 400, compared to a case where no barrier plates are installed. Thus, the thin film deposition apparatus 100 and the substrate 400 can be separated from each other by a set or predetermined distance, as will be described later in more detail.

The first barrier plate frame 132, which is formed on sides of the first barrier plates 131, maintains the positions of the first barrier plates 131, and guides the deposition material 115, which is discharged through the deposition source nozzles 121, not to flow in the Y-axis direction.

The deposition source nozzle unit 120 and the first barrier plate assembly 130 may be separated from each other by a set or predetermined distance. This may prevent the heat radiated from the deposition source unit 110 from being conducted to the first barrier plate assembly 130. However, aspects of the present invention are not limited to this. For example, an appropriate heat insulator may be further disposed between the deposition source nozzle unit 120 and the first barrier plate assembly 130. In this case, the deposition source nozzle unit 120 and the first barrier plate assembly 130 may be bound together with the heat insulator therebetween.

In addition, the first barrier plate assembly 130 may be constructed to be detachable from the thin film deposition apparatus 100. In the thin film deposition apparatus 100 according to an embodiment of the present invention, the deposition space is enclosed by using (or defined by) the first barrier plate assembly 130, so that the deposition material 115 that remains undeposited is mostly deposited within the first barrier plate assembly 130. Thus, since the first barrier plate assembly 130 is constructed to be detachable from the thin film deposition apparatus 100, when a large amount of the deposition material 115 lies in the first barrier plate assembly 130 after a long deposition process, the first barrier plate assembly 130 may be detached from the thin film deposition apparatus 100 and then placed in a separate deposition material recycling apparatus in order to recover the deposition material 115. Due to the structure of the thin film deposition apparatus 100 according to an embodiment, a reuse rate of the deposition material 115 is increased, so that deposition efficiency is improved, and thus manufacturing costs are reduced.

The patterning slit sheet 150 and a frame 155 in which the patterning slit sheet 150 is bound are disposed between the deposition source 110 and the substrate 400. The frame 155 may be formed in a lattice shape, similar to a window frame. The patterning slit sheet 150 is bound inside the frame 155. The patterning slit sheet 150 includes a plurality of patterning slits 151 arranged in parallel in the X-axis direction. The patterning slits 151 extend in the Y-axis direction. The deposition material 115 that has been vaporized in the deposition source 110 and passed through the deposition source nozzle 121 passes through the patterning slits 151 towards the substrate 400.

The patterning slit sheet 150 may be formed of a metal thin film. The patterning slit sheet 150 is fixed to the frame 155 such that a tensile force is exerted thereon. The patterning slits 151 may be formed by etching the patterning slit sheet 150 to have a stripe pattern.

In the thin film deposition apparatus 100 according to an embodiment of the present invention, the total number of patterning slits 151 may be greater than the total number of deposition source nozzles 121. In addition, there may be a greater number of patterning slits 151 than deposition source nozzles 121 disposed between two adjacent first barrier plates 131. The number of patterning slits 151 may be equal (or identical) to the number of deposition patterns to be formed on the substrate 400.

In addition, the first barrier plate assembly 130 and the patterning slit sheet 150 may be disposed to be separated from each other by a set or predetermined distance. Alternatively, the first barrier plate assembly 130 and the patterning slit sheet 150 may be connected by a connection member 135. The temperature of the first barrier plate assembly 130 may increase to 100° C. or higher due to the deposition source 110 of which the temperature is high. Thus, in order to prevent the heat of the first barrier plate assembly 130 from being conducted to the patterning slit sheet 150, the first barrier plate assembly 130 and the patterning slit sheet 150 are separated from each other by a set or predetermined distance.

As described above, the thin film deposition apparatus 100 according to an embodiment of the present invention performs deposition while being moved relative to the substrate 400. In order to move the thin film deposition apparatus 100 relative to the substrate 400, the patterning slit sheet 150 is separated from the substrate 400 by a set or predetermined distance. In addition, in order to prevent the formation of a relatively large shadow zone on the substrate 400 when the patterning slit sheet 150 and the substrate 400 are separated from each other, the first barrier plates 131 are arranged between the deposition source nozzle unit 120 and the patterning slit sheet 150 to assist or force the deposition material 115 to move in a straight direction. Thus, the size of the shadow zone that may be formed on the substrate 400 is sharply reduced.

In a conventional deposition method using a FMM, deposition is performed with the FMM in close contact with a substrate in order to reduce or prevent the formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

Accordingly, in the thin film deposition apparatus 100 according to an embodiment of the present invention, the patterning slit sheet 150 is disposed to be separated from the substrate 400 by a set or predetermined distance. This may be facilitated by installing the first barrier plates 131 to reduce the size of the shadow zone formed on the substrate 400.

As described above, when the patterning slit sheet 150 is manufactured to be smaller than the substrate 400, the patterning slit sheet 150 may be moved relative to the substrate 400 during deposition. Thus, it is no longer necessary to manufacture a large FMM as used in the conventional deposition method. In addition, since the substrate 400 and the patterning slit sheet 150 are separated from each other, defects caused due to contact therebetween may be prevented. In addition, since it is unnecessary to contact the substrate 400 with the patterning slit sheet 150 during a deposition process, the manufacturing speed may be improved.

Also, the thin film deposition apparatus 100 according to an embodiment of the present invention further includes the second barrier plate 170 at one side of the patterning slit sheet 150. The second barrier plate 170 will now be described in more detail.

As described above, the patterning slit sheet 150 may be much smaller than the FMM used in the conventional deposition method, but the patterning slit sheet 150 may also bend downward due to its own gravity. Also, the deposition material 115 is forced to move straight by installing the first barrier plate assembly 130, so that the size of the shadow zone formed on the substrate 400 is remarkably reduced. However, due to the imbalance of deposited amount of the deposition material 115 in each sub-deposition space S, a thickness of a thin film deposited in each sub-deposition space S may not be uniform.

Accordingly, the thin film deposition apparatus 100 according to an embodiment of the present invention includes the second barrier plate 170 disposed at one side of the patterning slit sheet 150, wherein an inner part of the second barrier plate 170 is partitioned into a plurality of spaces by a plurality of barrier ribs 171. Here, the second barrier plate 170 may have a honeycomb shape structure and include a plurality of hexagonal pillars formed by the barrier ribs, and the hexagonal pillars are closely formed to each other (or adjacent to each other).

The second barrier plate 170 may be formed at one side of the patterning slit sheet 150. In more detail, the second barrier plate 170 may be formed on a surface of the patterning slit sheet 150, which faces the deposition source 110. As shown in FIG. 6, the second barrier plate 170 may have the honeycomb shape, wherein surfaces of a plurality of hollow regular hexagonal pillars contact each other. The second barrier plate 170 having the honeycomb shape is adhered to the patterning slit sheet 150, thereby protecting or preventing the patterning slit sheet 150 from bending by its own weight or in its own gravity direction, i.e., in a negative Z-axis direction of FIG. 3.

Accordingly, four corners of the second barrier plate 170 may be combined to the frame 155.

Here, the second barrier plate 170 is formed to have a honeycomb shape, wherein the surfaces of the plurality of hollow regular hexagonal pillars contact each other, due to following reasons. As described above, deposition is performed on the thin film deposition apparatus 100 according to an embodiment of the present invention in a scanning manner as the thin film deposition apparatus 100 or the substrate 400 is moved relative to each other. Here, if the second barrier plates 170 are disposed in parallel to each other like the first barrier plates 131, a discontinuous surface may be generated in a boundary area of the neighboring second barrier plates 170, which adversely affects light-emitting characteristics of an organic light-emitting display device. However, if the second barrier plate 170 has the honeycomb shape as in the current embodiment, the deposition is performed in a scanning manner as the thin film deposition apparatus 100 or the substrate 400 is moved relative to each other. Accordingly, the amounts of deposition material 115 passing through each patterning slit 151 are uniform, and thus uniformity of a thin film is increased or maintained.

Also, by disposing the second barrier plate 170 at one side of the patterning slit sheet 150, only the deposition materials 115, which are straightly incident on the patterning slit sheet 150 (i.e., which are incident on the patterning slit sheet 150 almost perpendicularly at a predetermined angle or above), pass through the patterning slit sheet 150; and the deposition materials 115, which are slantly incident on the patterning slit sheet 150, are blocked by the second barrier plate 170, thereby remarkably reducing the size of the shadow zone.

In FIG. 6, the second barrier plate 170 is formed with the surfaces of the hollow regular hexagonal pillars contacting each other, but an aspect of the present invention is not limited thereto, and the second barrier plate 170 may be formed using various suitable shapes, such as columns, triangular pillars, rectangular pillars, or octagonal pillars.

According to the thin film deposition apparatus 100 of an embodiment of the present invention, the patterning slit sheet 150 may be prevented from bending downward due to its own weight or gravity. Also, uniformity of thicknesses of the thin films deposited in each sub-deposition space S partitioned by the first barrier plates 131 may be further improved.

As described above, a thin film deposition apparatus according to an embodiment of the present invention is suitable for manufacturing large-sized display devices on a mass scale and can be used for high-definition patterning. The thin film deposition apparatus according to an embodiment of the present invention also may be used to manufacture an organic light-emitting display device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light-emitting display device by a thin film deposition apparatus comprising a deposition source, a deposition source nozzle unit, a patterning slit sheet, a first barrier plate assembly, and a second barrier plate, the method comprising:
   providing a deposition source comprising a crucible and an organic deposition material inside the crucible;
   arranging the deposition source nozzle unit at a side of the deposition source, the deposition source nozzle unit comprising a plurality of deposition source openings arranged in a first direction;
   arranging the patterning slit sheet to face the deposition source nozzle unit, the patterning slit sheet comprising a plurality of patterning slits arranged in the first direction and configured to form a deposition pattern along the first direction on a substrate;
   arranging the first barrier plate assembly comprising a plurality of first barrier plates disposed between the deposition source nozzle unit and the patterning slit sheet in the first direction, and partitioning with the first barrier plates a space between the deposition source nozzle unit and the patterning slit sheet into a plurality of sub-deposition spaces;
   arranging the second barrier plate at one side of the patterning slit sheet, wherein an inner part of the second barrier plate is partitioned into a plurality of spaces by a plurality of barrier ribs of the second barrier plate;
   fixing the substrate fixed to a chuck; and
   discharging the organic deposition material from the deposition source and moving the film deposition apparatus or the substrate fixed to the chuck so that the patterning slit sheet and the substrate move relative to each other while deposition is performed on the substrate,
   wherein the plurality of patterning slits extend in a second direction crossing the first direction.

2. An organic light-emitting display device manufactured utilizing the method of claim 1.

3. The method of claim 1, wherein the thin film deposition apparatus is separated from the substrate by a distance, and the thin film deposition apparatus or the substrate is movable relative to each other.

4. The method of claim 1, wherein the second barrier plate has a honeycomb shape structure and comprises a plurality of hollow hexagonal pillars formed by the barrier ribs, and the hollow hexagonal pillars are formed adjacent to each other.

5. The method of claim 4, wherein the second barrier plate is formed in which each surface of the hollow hexagonal pillars contacts a neighboring one of the hollow hexagonal pillars.

6. The method of claim 4, wherein each surface of the hollow hexagonal pillars has an identical shape.

7. The method of claim 4, wherein each surface of the hollow hexagonal pillars has an identical shape, and the second barrier plate is formed in which each surface of the hollow hexagonal pillars contacts a neighboring one of the hollow hexagonal pillars.

8. The method of claim 1, wherein the second barrier plate is on the side of the patterning slit sheet facing the deposition source.

9. The method of claim 8, further comprising a frame having a window frame shape, wherein the patterning slit sheet is in a region defined by inners sides of the frame, and the second barrier plate is fixed to the frame.

10. The method of claim 8, wherein the patterning slit sheet and the second barrier plate are adhered to each other.

11. The method of claim 1, wherein the first barrier plate assembly is configured to guide the deposition material discharged from the deposition source.

12. The method of claim 1, wherein the plurality of first barrier plates are arranged at identical intervals.

13. The method of claim 1, wherein each of the plurality of first barrier plates extends in the second direction substantially perpendicular to the first direction, in order to partition the space between the deposition source nozzle unit and the patterning slit sheet into the plurality of sub-deposition spaces.

14. The method of claim 1, wherein the discharging of the deposition material from the thin film deposition apparatus on the substrate is conducted continuously while the substrate or the thin film deposition apparatus is moved.

15. The method of claim 1, wherein the thin film deposition apparatus or the substrate is movable relative to the other along a plane parallel to a surface of the substrate, on which the deposition material is deposited.

16. The method of claim 1, wherein the patterning slit sheet of the thin film deposition apparatus is smaller than the substrate.

17. The method of claim 1, wherein the first barrier plate assembly is detachable from the thin film deposition apparatus.

18. A method of manufacturing an organic light-emitting display device by a thin film deposition apparatus comprising a deposition source, a deposition source nozzle unit, a patterning slit sheet, a first barrier plate assembly, and a second barrier plate, the method comprising:

provid­ing a deposition source comprising a crucible and an organic deposition material inside the crucible;

arranging the deposition source nozzle unit at a side of the deposition source, the deposition source nozzle unit comprising a plurality of deposition source openings arranged in a first direction;

arranging the patterning slit sheet to face the deposition source nozzle unit, the patterning slit sheet comprising a plurality of patterning slits arranged in the first direction and configured to form a deposition pattern along the first direction on a substrate;

arranging the first barrier plate assembly comprising a plurality of first barrier plates disposed between the deposition source nozzle unit and the patterning slit sheet in the first direction, and partitioning with the first barrier plates a space between the deposition source nozzle unit and the patterning slit sheet into a plurality of sub-deposition spaces;

arranging the second barrier plate at one side of the patterning slit sheet, wherein an inner part of the second barrier plate is partitioned into a plurality of spaces by a plurality of barrier ribs of the second barrier plate;

fixing the substrate fixed to a chuck; and discharging the organic deposition material from the deposition source and moving the film deposition apparatus or the substrate fixed to the chuck so that the patterning slit sheet and the substrate move relative to each other while deposition is performed on the substrate, wherein a temperature of the first barrier plate assembly is lower than a temperature of the deposition source.

19. The method of claim 18, wherein the first barrier plate assembly is heat insulated from the deposition source nozzle unit by a heat insulator or a heat insulation space.

20. The method of claim 18, wherein the temperature of the first barrier plate assembly is about 100° C. or less.

* * * * *